US010923685B2

(12) United States Patent
Wang et al.

(10) Patent No.: US 10,923,685 B2
(45) Date of Patent: Feb. 16, 2021

(54) DISPLAY AND METHOD OF FABRICATING THE DISPLAY

(71) Applicants: BOE TECHNOLOGY GROUP CO., LTD., Beijing (CN); ORDOS YUANSHENG OPTOELECTRONICS CO., LTD., Ordos (CN)

(72) Inventors: Jianqiang Wang, Beijing (CN); Jin Xu, Beijing (CN); Ning Ao, Beijing (CN); Qi Liu, Beijing (CN)

(73) Assignees: BOE TECHNOLOGY GROUP CO., LTD., Beijing (CN); ORDOS YUANSHENG OPTOELECTRONICS CO., LTD., Ordos (CN)

(*) Notice: Subject to any disclaimer, the term of this patent is extended or adjusted under 35 U.S.C. 154(b) by 0 days.

(21) Appl. No.: 16/201,245

(22) Filed: Nov. 27, 2018

(65) Prior Publication Data
US 2019/0355936 A1 Nov. 21, 2019

(30) Foreign Application Priority Data

May 17, 2018 (CN) .......................... 2018 1 0474863

(51) Int. Cl.
H01L 51/52 (2006.01)
H01L 27/32 (2006.01)
H01L 51/56 (2006.01)
H01L 41/04 (2006.01)
H01L 41/09 (2006.01)

(52) U.S. Cl.
CPC ...... H01L 51/5281 (2013.01); H01L 27/3225 (2013.01); H01L 27/3244 (2013.01); H01L 41/042 (2013.01); H01L 41/0986 (2013.01); H01L 51/524 (2013.01); H01L 51/56 (2013.01); H01L 2227/323 (2013.01)

(58) Field of Classification Search
None
See application file for complete search history.

(56) References Cited

U.S. PATENT DOCUMENTS

2014/0063365 A1* 3/2014 Li .................... G06F 3/0412
349/12
2015/0371573 A1* 12/2015 Choi ................. H01L 51/5284
345/206

FOREIGN PATENT DOCUMENTS

CN 201638192 U 11/2010
CN 106252381 A 12/2016
(Continued)

OTHER PUBLICATIONS

Second Office Action for CN Patent Application No. 201810474863.0, dated May 25, 2020.

Primary Examiner — Nicholas J Tobergte
Assistant Examiner — Kien C Ly
(74) Attorney, Agent, or Firm — Dinsmore & Shohl LLP

(57) ABSTRACT

This disclosure relates to a display and a method of fabricating the display. According to some embodiments, the display may comprise: an encapsulation sidewall; at least one isolation column adjacent to the encapsulation sidewall; and a processing module coupled with the at least one isolation column, configured to apply a voltage signal to the at least one isolation column according to a height of the encapsulation sidewall, such that the at least one isolation column deforms.

10 Claims, 8 Drawing Sheets

(56) References Cited

FOREIGN PATENT DOCUMENTS

| CN | 107505788 A | 12/2017 |
|---|---|---|
| JP | 2004280759 A | 10/2004 |

* cited by examiner

DISPLAY AND METHOD OF FABRICATING THE DISPLAY

CROSS-REFERENCE TO RELATED APPLICATIONS

This application claims the benefit of and priority to the Chinese Patent Application No. 201810474863.0, filed on May 17, 2018, and entitled "A DISPLAY, A METHOD OF FABRICATING THE DISPLAY, AND A DISPLAY PROCESSING METHOD", the disclosure of which is hereby incorporated by reference in its entirety into this application.

TECHNICAL FIELD

The present disclosure relates to a display, and a method of fabricating the display.

BACKGROUND

With the rapid development of display technologies, performances of display devices in all aspects have been greatly improved, and the package structure of the display device will affect its display effect to a certain extent.

At present, in the package structure in which a glass glue (Frit) serves as a glue for encapsulation, during its production process, since a height of the glass encapsulation glue cannot match the height of an isolation column (Photo Space, briefly referred to as PS), after an encapsulation cover plate (Encapsulation, briefly referred to as Encap) is stuck, a side of the encapsulation cover plate close to the display devices is in a non-planar shape, resulting in an optical path difference between the reflected light arriving at the substrate (Basilar Plate, briefly referred to as BP) and the reflected light of the encapsulation cover plate, whereby a stripe-like Newton ring phenomenon occurs.

SUMMARY

According to some embodiments of this disclosure, a display is provided, comprising: an encapsulation sidewall; at least one isolation column adjacent to the encapsulation sidewall; and a processing module coupled with the at least one isolation column, configured to apply a voltage signal to the at least one isolation column according to a height of the encapsulation sidewall, such that the at least one isolation column deforms.

According to some embodiments of this disclosure, the encapsulation sidewall is arranged on a periphery of a non-display area. The at least one isolation column is arranged on a side of the encapsulation sidewall close to the display area. The processing module is configured to apply the voltage signal to the at least one isolation column in a corresponding position according to the height of the encapsulation sidewall, such that the at least one isolation column deforms.

According to some embodiments of this disclosure, a first metal layer is arranged on the bottom of the at least one isolation column, a second metal layer is arranged at the top thereof, and the first metal layer and the second metal layer are respectively connected with the processing module, so as to form a loop comprising the first metal layer, the at least one isolation column, the second metal layer and the processing module.

According to some embodiments of this disclosure, the at least one isolation column is made of a piezoelectric material.

According to some embodiments of this disclosure, the at least one isolation column is configured to deform to have a higher height when a forward voltage signal is received, and to deform to have a lower height when a reverse voltage signal is received. According to some embodiments of disclosure, the at least one isolation column is configured to deform to have a lower height when a forward voltage signal is received, and to deform to have a higher height when a reverse voltage signal is received.

According to some embodiments of this disclosure, a pixel definition layer is arranged below the first metal layer, a metal wire is arranged in a via of the pixel definition layer, and the metal wire is used for connecting the first metal layer and the processing module.

According to some embodiments of this disclosure, the display is an organic electroluminescent display (OLED), and the second metal layer is a cathode layer of a light-emitting element in the OLED.

According to some embodiments of this disclosure, the encapsulation sidewall is made of a material that is a glass encapsulation glue, wherein the encapsulation sidewall comprises one or more of the following: a circle of the encapsulation sidewall arranged outside the display area and in a border region with the non-display area, or a circle of the encapsulation sidewall arranged inside the display area and in a border region with the non-display area.

According to some embodiments of this disclosure, the at least one isolation column is a circle of a continuous isolation column located on a side of the encapsulation sidewall close to the display area.

According to some other embodiments of this disclosure, the at least one isolation column is a plurality of isolation columns in a circle located on a side of the encapsulation sidewall close to the display area.

According to some embodiments of this disclosure, the processing module stores the height of the encapsulation sidewall, and the height of the encapsulation sidewall is obtained through measurement by an external device before the encapsulation cover plate is stuck to the display.

According to some other embodiments of this disclosure, the display further comprises a detection module arranged inside the encapsulation cover plate of the display, wherein the detection module is configured to detect the height of the encapsulation sidewall after turning on the display.

According to some embodiments of this disclosure, the height of the encapsulation sidewall comprises a height set formed by a plurality of positions around the encapsulation sidewall, wherein that the processing module is configured to apply a voltage signal to the at least one isolation column in a corresponding position according to the height of the encapsulation sidewall comprises: forming a relative height set according to the height set of the encapsulation sidewall, and applying the voltage signal to the at least one isolation column in the corresponding position according to the relative height set.

According to some embodiments of this disclosure, each element in the relative height set of the encapsulation sidewall includes relative height information and position information, wherein that the processing module applies the voltage signal to the at least one isolation column in the corresponding position according to the relative height set comprises: according to the relative height set, applying a voltage signal with a magnitude corresponding to the relative height information of each element, to an isolation column in a position corresponding to the position information of the element.

According to some embodiments of this disclosure, a method of fabricating a display is provided, comprising: forming an isolation structure on a periphery of a non-display area of the display, wherein the isolation structure comprises at least one isolation column, and a first metal layer on the bottom of the at least one isolation column; forming a second metal layer at the top of the at least one isolation column, wherein the first metal layer and the second metal layer are respectively connected with the processing module of the display; and forming a loop comprising the first metal layer, the at least one isolation column, the second metal layer and the processing module; and forming an encapsulation sidewall on a side of the at least one isolation column away from a display area.

According to some embodiments of this disclosure, before forming the isolation structure, the method further comprises: forming a pixel definition layer on a periphery of the non-display area; forming a via on the pixel definition layer; and forming a metal wire in the via.

According to some embodiments of this disclosure, the forming an isolation structure comprises: forming the first metal layer on the pixel definition layer, and forming the at least one isolation column on the first metal layer, wherein the metal wire in the pixel definition layer is connected with the first metal layer.

According to some embodiments of this disclosure, the forming a loop comprises: forming a metal line of the display, such that the metal wire in the pixel definition layer and the second metal layer are respectively connected with the processing module, and forming a loop comprising the first metal layer, the isolation column, the second metal layer and the processing module.

According to some embodiments of this disclosure, the fabricating method further comprises: forming an encapsulation cover plate on the encapsulation sidewall and the at least one isolation column.

According to some embodiments of this disclosure, a method is provided, comprising: generating a voltage signal according to a height of an encapsulation sidewall of a display; and applying the generated voltage signal to at least one isolation column adjacent to the encapsulation sidewall, according to the height of the encapsulation sidewall, such that the at least one isolation column deforms.

According to some embodiments of this disclosure, the encapsulation sidewall is arranged on a periphery of a non-display area; the at least one isolation column is arranged on a side of the encapsulation sidewall close to a display area; the method comprises: applying the voltage signal to the at least one isolation column in corresponding positions according to the height of the encapsulation sidewall, such that the at least one isolation column deforms.

According to some embodiments of this disclosure, the height of the encapsulation sidewall comprises a height set formed by a plurality of positions around the encapsulation sidewall, wherein generating a voltage signal according to a height of an encapsulation sidewall comprises: forming a relative height set according to the height set of the encapsulation sidewall, and generating a plurality of voltage signals according to the relative height set.

According to some embodiments of this disclosure, a computer device is further provided, comprising: a memory and a processor, wherein the memory is configured to store executable instructions, and the processor is configured to implement the method according to any of the above while executing the executable instructions stored in the memory.

According to some embodiments of this disclosure, a computer readable storage medium is further provided, wherein the computer readable storage medium stores executable instructions, which, when executed by the processor, implement the method according to any of the above.

BRIEF DESCRIPTION OF THE DRAWINGS

The accompanying drawings, which constitute a part of the specification, provide further understandings of the technical solutions in this disclosure and, together with the embodiments in this application, serve to explain the technical solutions of this disclosure, and do not constitute limitations to the technical solutions of this disclosure.

DETAILED DESCRIPTION

In order to make the objectives, technical solutions, and advantages of this disclosure clearer and more comprehensible, the embodiments of this disclosure are described in detail in the following with reference to the accompanying drawings. It should be noted that, without conflicts, the embodiments in the present application and the features in the embodiments can be arbitrarily combined with each other.

The embodiments provided by this disclosure as examples can be combined with each other, and for those identical or similar concepts or processes, they are possibly omitted in some embodiments.

Figure 1:
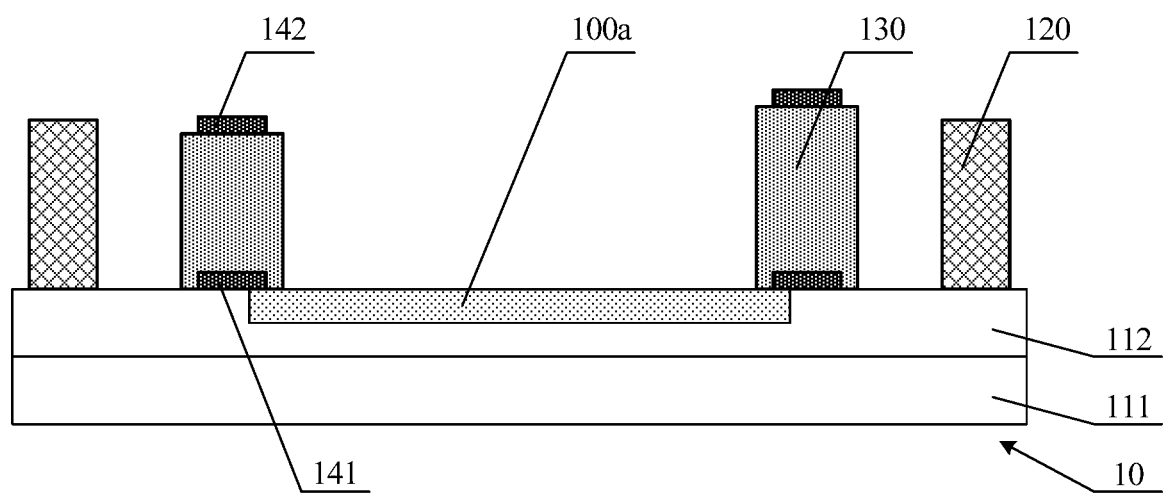
FIG. 1 is a schematic diagram showing a structure of a display provided according to some embodiments of this disclosure.

FIG. 1 is a schematic diagram showing a structure of a display provided according to some embodiments of this disclosure. As shown in FIG. 1, the display 10 may comprise: an encapsulation sidewall 120; at least one isolation column 130 arranged adjacent to the encapsulation sidewall. The display 10 may further comprise a processing module (not shown in the figure) coupled with the at least one isolation column 130.

In some embodiments, as shown in FIG. 1, the encapsulation sidewall 120 is arranged on a periphery of a non-display area, and the at least one isolation column 130 is arranged on a side of the encapsulation sidewall 120 close to the display area 100a.

In some embodiments, as shown in FIG. 1, a first metal layer 141 is arranged on the bottom of the isolation column 130, a second metal layer 142 is arranged at the top thereof, and the first metal layer 141 and the second metal layer 142 are respectively connected with the processing module, to form a loop comprising the first metal layer 141, the isolation column 130, the second metal layer 142 and the processing module.

The processing module is configured to apply a voltage signal to an isolation column 130 in a corresponding position according to the height of the encapsulation sidewall 120, such that the isolation column deforms, thereby eliminating or reducing a height difference between the encapsulation sidewall 120 and the isolation column 130 in the corresponding position.

In some embodiments of this disclosure, the package structure of the display 10 may include an encapsulation sidewall 120 and an encapsulation cover plate (not shown in FIG. 1) located on a periphery of the non-display area. In some embodiments, the material for the encapsulation sidewall 120 can select a glass encapsulation glue (Frit). As shown in FIG. 1, the encapsulation sidewall 120, the isolation column 130, the first metal layer 141 and the second metal layer 142 are located on a side of the substrate 111 close to the encapsulation cover plate, and there may further comprise a planarization layer (briefly referred to as PLN) 112 between the substrate 111 and the above structure. Depending on relevant processes of the display, the PLN 112 can include a thin film transistor (briefly referred to as TFT) array layer, a light-emitting pixel layer, etc.

Figure 2:
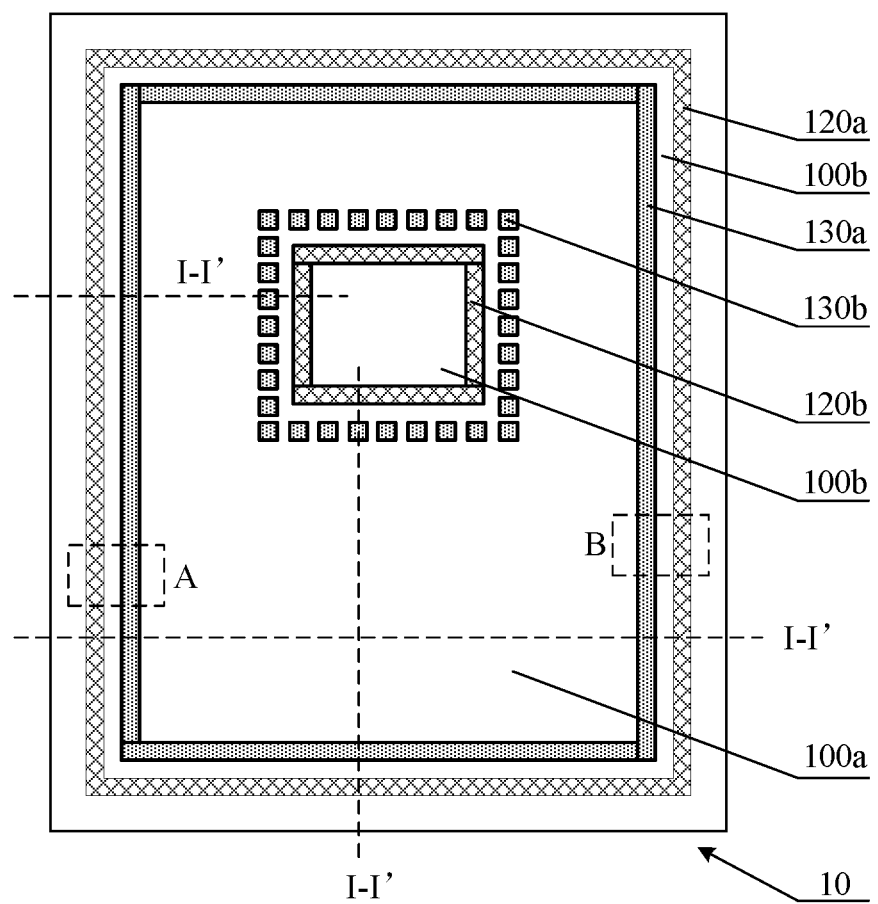
FIG. 2 is a top view showing a display provided according to some embodiments of this disclosure.

FIG. 2 is a top view showing a display provided according to some embodiments of this disclosure. As shown in FIG. 2, the encapsulation sidewall 120 may comprise a circle of the encapsulation sidewall 120a arranged outside the display area 100 and in a border region with the non-display area 100b, and the encapsulation sidewall 120a in this region is used for encapsulating a frame of the display panel. In some embodiments, the encapsulation sidewall 120 may further comprise a circle of the encapsulation sidewall 120b arranged inside the display area 100a and in the border region with the non-display area 100b, and the encapsulation sidewall 120b in this region may be used for encapsulating an opening area inside the display panel. The opening area is used for camera, flash lamp and solid keys, for example. Depending on a type and a specific structure of the display 10, the encapsulation sidewall 120b can be selectively arranged.

It should be noted that, FIG. 2 illustrates the encapsulation sidewall 120a outside the display area 100a and the encapsulation sidewall 120b inside the display area 100a, and the encapsulation sidewall 120b shown in FIG. 2 is merely an illustration, and it does not mean that the number and specific setting positions of the encapsulation sidewall 120b inside the display area 100a are merely as shown in FIG. 2.

Refer to FIG. 1 and FIG. 2, in the border region between the display area 100a and the non-display area 100b (specifically in the non-display area 100b), and on a side of the encapsulation sidewall 120 close to the display area 100a, isolation columns 130a are further arranged, that is, the encapsulation sidewall 120a and the isolation column 130a are in an adjacent position relation, and the encapsulation cover plate is stuck to the top of the encapsulation sidewall 120a and the isolation column 130a arranged adjacent to one another, i.e., stuck to an end of the encapsulation sidewall 120a away from the substrate 111. In the encapsulation process of the display in related technologies, the production line usually adopts the screen printing technology for fabricating the encapsulation sidewall, but the process has the following technical defect: the encapsulation sidewall 120 has a level difference along the horizontal and vertical directions of the scrapper, that is, as shown in FIG. 2, the encapsulation sidewall (including 120a and 120b) has an uneven height, and it is unlikely for related encapsulating technologies to improve the phenomenon of inconsistent height of the encapsulation sidewall, therefore, the problem that the height of the encapsulation sidewall and the height of the isolation column do not match occurs, so that the phenomenon of Newton rings occurs on the display screen.

Figure 3:
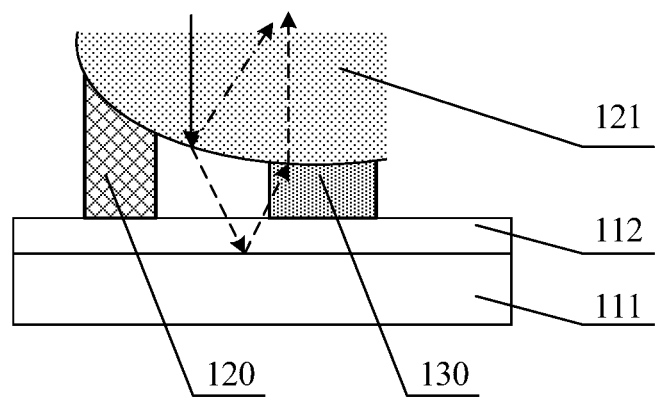
FIG. 3 is a schematic diagram showing a principle of generating Newton rings in the display.
Figure 4:
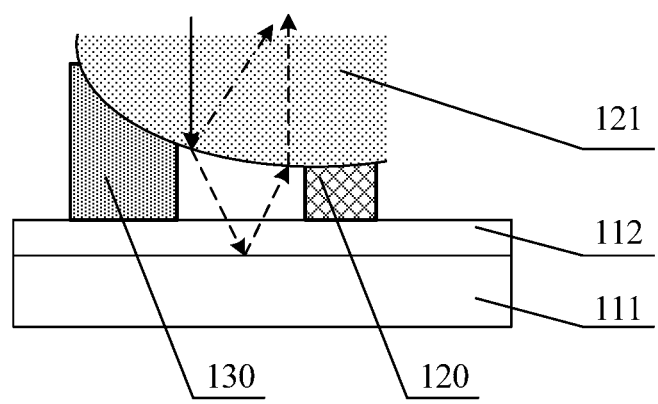
FIG. 4 is a schematic diagram showing another principle of generating Newton rings in the display.
Figure 5:
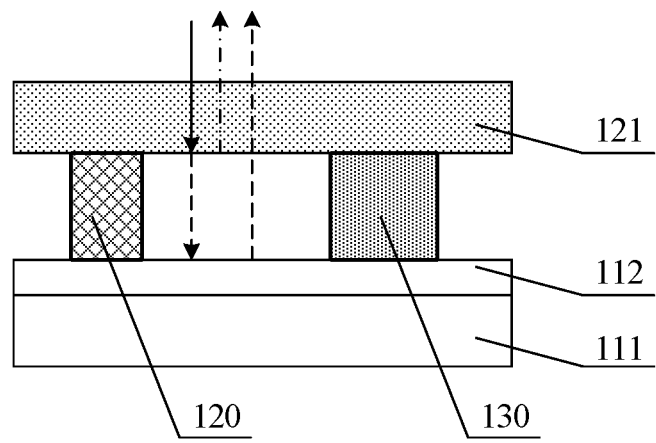
FIG. 5 is a schematic diagram showing normal display of the display.

FIG. 3 is a schematic diagram showing a principle of generating Newton rings in the display. FIG. 4 is a schematic diagram showing another principle of generating Newton rings in the display. FIG. 5 is a schematic diagram showing normal display of the display. The region shown in FIG. 3 is an enlarged schematic diagram of the region A in FIG. 2, and in the region A, the encapsulation sidewall 120 is higher than the isolation column 130 in the adjacent position; due to the existence of a height difference herein, a side of the stuck encapsulation cover plate 121 close to the substrate 111 is not a plane, but has a certain radian (shown in FIG. 3); in this way, the light is incident to the encapsulation cover plate 121, a certain optical path difference exists between the light reflected from the inner wall of the encapsulation cover plate 121 and the light reflected from the substrate 111, and a stripe-like Newton ring phenomenon occurs. The region shown in FIG. 4 is an enlarged schematic diagram of the region B in FIG. 2, and in the region B, the encapsulation sidewall 120 is lower than the isolation column 130 in the adjacent position; based on the same reason as the encapsulation cover plate 121 in FIG. 3, the encapsulation cover plate 121 in this position also has a certain radian (as shown in FIG. 4), and the stripe-like Newton ring phenomenon also occurs. The encapsulation sidewall 120 in FIG. 5 has the same height as the isolation column 130, and there is no optical path difference between the light reflected from the inner wall of the encapsulation cover plate 121 and the light reflected from the substrate 111, so no Newton ring phenomenon occurs.

Taking OLED as an example of the display, in the principle of generating the Newton rings as shown in FIG. 3 and FIG. 4, the optical path difference is calculated by the following equations:

$$\sigma = 2d + \tfrac{1}{2}\lambda = K\lambda; \tag{1}$$

$$\sigma = 2d + \tfrac{1}{2}\lambda = (2K+1)\tfrac{1}{2}\lambda; \tag{2}$$

In the above equations (1) and (2), $\sigma$ is the optical path difference between the light reflected from the inner wall of the encapsulation cover plate 121 and the light reflected from the substrate 111, is a wavelength of the light, and d is a gas layer thickness of nitrogen (N2) between the encapsulation cover plate 121 and the substrate 111; since the material of the OLED is easily eroded by water and oxygen, the interior of the display panel is filled with N2 as a protective measure. When the optical path difference is in the case of the equation (1), Newton Rings of bright stripes are generated, and when the optical path difference is in the case of the equation (2), Newton rings of dark stripes are generated.

According to the principle of generating the Newton rings shown in FIG. 3 and FIG. 4 above, and the fact that the height of the encapsulation sidewall and the height of the isolation column in the display of the related technologies are difficult to match, it is difficult to eliminate the Newton ring phenomenon in the display of the related technologies, which adversely affects the display effect of the display.

In the related technologies, it is difficult to improve the height of the encapsulation sidewall 120 by improving the screen printing process. The height difference between the isolation column 130 and the encapsulation sidewall 120 is generally less than 0.5 microns (um). Based on the above situation, some embodiments of this disclosure reduce or eliminate the height difference between the encapsulation sidewall 120 and the isolation column 130 in the corresponding position by controlling the height of the isolation column 130.

In some embodiments, the processing module coupled to the isolation column applies a corresponding voltage signal to the isolation column 130 based on the height difference between the isolation column 130 and the encapsulation sidewall 120, so that the isolation column 130 produces a deformation that reduces or eliminates the height difference.

In some embodiments, for example, the height of the isolation column 130 can be controlled by: providing a metal layer respectively on the bottom and at the top of the isolation column 130, including the first metal layer 141 arranged on the bottom and the second metal layer 142 at the top, and connecting the first metal layer 141 and the second metal layer 142 respectively with the processing module to form a loop, wherein the loop comprises the first metal layer 141, the isolation column 130, the second metal layer 142 and the processing module, as well as other metal lines. In this way, the processing module can apply a voltage signal to the isolation column in the loop through the first metal layer 141 and the second metal layer 142, the magnitude of the voltage signal is related to the height of the encapsulation sidewall 120, and the voltage signal can make the isolation column deform to eliminate the height difference with the encapsulation sidewall 120, thereby achieving the purpose of eliminating Newton rings.

The display provided according to some embodiments of this disclosure, by providing the first metal layer on the bottom of the isolation column adjacent to the encapsulation sidewall, and the second metal layer at the top thereof, and connecting the first metal layer and the second metal layer respectively with the processing module to form a loop comprising the first metal layer, the isolation column and the second metal layer, the processing module in the loop can apply a voltage signal to the isolation column in the corresponding position according to the height of the encapsulation sidewall, such that the isolation column in this position deforms to change its height, so as to eliminate Newton rings by cancelling out the height difference between the isolation column and the encapsulation sidewall. Some embodiments in this disclosure, by reasonably designing the relevant structures of the isolation column in the display, effectively eliminates the phenomenon of Newton rings on the display screen due to inconsistent height of the encapsulation sidewall, and improves the display effect of the display.

Further, the display structure provided according to some embodiments of this disclosure is simple, easy to implement, easy to apply to the actual production, can improve the influence on yield of the display due to an instable process of the encapsulation sidewall, improves the production efficiency, and reduces production costs.

Alternatively, the isolation column 130 in some embodiments of this disclosure can select a piezoelectric material, and the isolation column 130 formed of the piezoelectric material, when receiving the voltage signal applied by the processing module, can deform. When a voltage signal is applied to the metal layers on the bottom and at the top of the isolation column 130 formed of the piezoelectric material, the crystal structure of the piezoelectric material will be retracted due to the piezoelectric effect, to convert electrical energy to mechanical energy, thereby changing the height of the isolation column 130 to realize controllability of the height of the isolation column 130. A specific direction of deformation is related to the type of the piezoelectric material and the type of the voltage applied.

In some embodiments of this disclosure, the isolation column 130, can deform to have a higher height when a forward voltage signal is received, and deform to have a lower height when a reverse voltage signal is received.

In some embodiments of this disclosure, the isolation column 130, can deform to have a lower height when a forward voltage signal is received, and deform to have a higher height when a reverse voltage signal is received.

Figure 6:
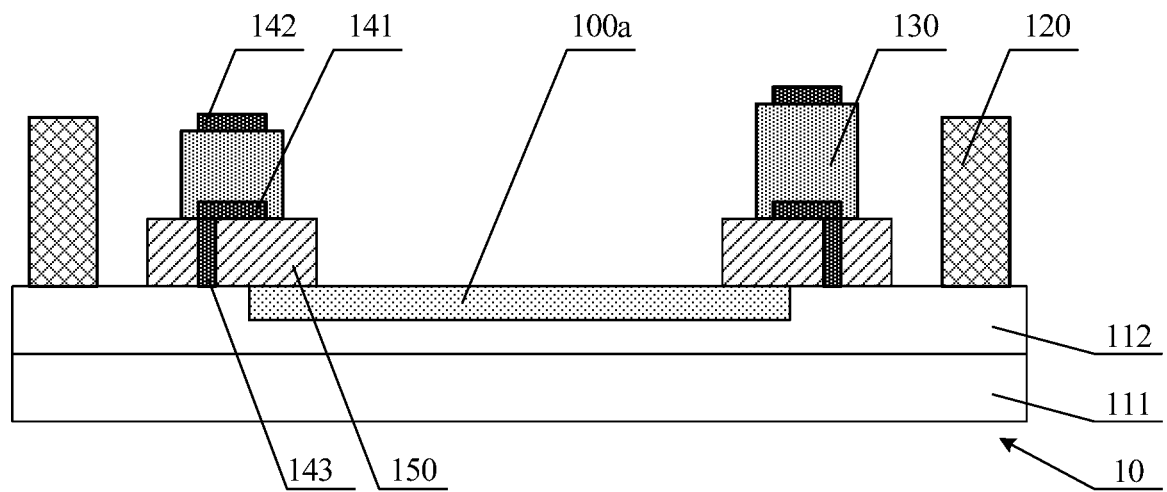
FIG. 6 is a schematic diagram showing a structure of another display provided according to some embodiments of this disclosure.

FIG. 6 is a schematic diagram showing a structure of another display provided according to some embodiments of this disclosure. As shown in FIG. 6, on the basis of the structure of the display shown in FIG. 1, a pixel definition layer (briefly referred to as PDL) is arranged below the first metal layer 141, a metal wire 143 is arranged in a via of the pixel definition layer 150, and the metal wire 143 is used for connecting the first metal layer 141 and the processing module.

Some embodiments of this disclosure, in practical applications, can connect the first metal layer 141 with the processing module by arranging the pixel definition layer 150, and arranging the metal wire 143 in the via of the pixel definition layer 150, in order to realize the connection of the loop.

Alternatively, the display 10 provided according to some embodiments of this disclosure for example can be an organic electroluminance display (briefly referred to as OLED) or a liquid crystal display (briefly referred to as LCD). When the display 10 is OLED, since the light-emitting element of the OLED includes an anode layer, an El Layer and a cathode layer, the second metal layer 142 can share the cathode layer of the light-emitting element in the OLED, that is, the cathode layer of the light-emitting element in the OLED serves as the second metal layer 142.

It should be noted that, FIGS. 1 and 6 both are sectional views in which I-I' of the display 10 shown in FIG. 2 is the cutting line. FIG. 2 shows three I-I', and FIG. 1 and FIG. 6 show only the isolation column 130a in the non-display area of the display 10, i.e., the isolation column located in the non-display area and adjacent to the encapsulation sidewall 120a.

In some embodiments, in the display area 100a of the display 10, an encapsulation sidewall 130b and an adjacent isolation column 130b can also be arranged; likewise, the height difference between the encapsulation sidewall 130b and the adjacent isolation column 130b can be eliminated, thereby eliminating the Newton ring phenomenon.

Alternatively, the isolation column according to some embodiments of this disclosure, can be a circle of the isolation columns 130a on a side of the encapsulation sidewall close to the display area 100a, that is, the isolation columns are arranged continuously, and FIG. 2 shows a circle of the isolation columns arranged continuously on an outer frame of the display area, as an example.

Alternatively, the isolation columns according to some embodiments of this disclosure, can be a plurality of isolation columns located on a side of the encapsulation sidewall close to the display area 100*a*, and arranged in a circle, that is, the isolation columns are a plurality of independent isolation columns arranged at intervals; FIG. 2 shows that a circle of the isolation columns 130*b* at the inner opening of the display area are arranged at intervals, as an example, in which the isolation columns can be columnar or stipe-like.

Alternatively, the processing module according to some embodiments of this disclosure obtains the height of the encapsulation sidewall 120 before applying a voltage to a position in the continuously arranged isolation column 130, or applying a voltage to a certain isolation column 130 arranged at intervals. If the encapsulate sidewall 120 is a continuously arranged structure, the obtained height is, for example, a multi-point height obtained at an interval of a preset step.

The height can be obtained for example by:

Mode 1: before sticking the encapsulation cover plate to the display 10, an external equipment is adopted for measurement to obtain the height of the encapsulation sidewall 120 in the display 10, and the display 10 shown in FIG. 2 can obtain the height of the encapsulation sidewall 120*a* on the outer periphery of the display area 100*a*, as well as the height of a circle of the encapsulation sidewall 120*b* in the inner opening position of the display area 100*a*, and store the obtained heights in the processing module.

It should be noted that in the Mode 1, because in the process of fabricating the display 10, usually multiple display panels are fabricated on one substrate, so the height of the encapsulation sidewall 120 can be obtained for the multiple display panels on this substrate.

Mode 2: the display 10 further comprises a detection module arranged inside the encapsulation cover plate, which is used for detecting the height of the encapsulation sidewall after the display is turned on. Since the Newton ring phenomenon only occurs after the display 10 is turned on, and the detection module is in an operating mode after the turning on, and the detection device is arranged in a position inside the encapsulation cover plate and against the encapsulation sidewall 120, the height of the encapsulation sidewall 120 can be obtained by measuring the height of the inner wall of the encapsulation cover plate.

Alternatively, in some embodiments according to this disclosure, the height of the encapsulation sidewall 120 includes a height set formed by a plurality of positions around the encapsulation sidewall, and accordingly, the implementation that the processing module applies the voltage signal to the isolation columns 130 in corresponding positions may comprise: forming a relative height set according to the height set of the encapsulation sidewall 120, and applying the voltage signal to the isolation columns 130 in the corresponding positions according to the relative height set.

In some embodiments according to this disclosure, each element in the relative height set of the encapsulation sidewall 120 includes relative height information and location information, and accordingly, the implementation that the processing module applies the voltage signal to the isolation columns in the corresponding positions according to the relative height set may comprise: according to the relative height set, applying the voltage signal with a magnitude corresponding to the relative height information of each element, to the isolation column 130 in a position corresponding to the position information of this element.

In some embodiments according to this disclosure, based on the form that the encapsulation sidewall 120 is continuously arranged, and based on the screen printing process for fabricating the encapsulation sidewall 120, the height of the encapsulation sidewall 120 is usually in a linear gradual change; as explained in the above embodiments, the height obtained is, for example, heights of a plurality of positions at an interval of a preset step, that is, it can be a height set, which includes a plurality of elements each including height information and corresponding location information. Since the height of the isolation column 130 is relatively stable, a relative height set can be obtained based on the height set of the encapsulation sidewall 120, and the relative height set can be a set of amounts to be adjusted for the isolation columns 130. For example, the height of the isolation column is 3 um, and the elements in the height set of the encapsulation sidewall include: height 1 of 2.9 um (corresponding to position 1), height 2 of 3.0 um (corresponding to position 2), height 3 of 3.1 um (corresponding to position 3), . . . ; then the elements in the relative height set can include: relative height 1 of −0.1 um (corresponding to position 1), relative height 2 of 0 um (corresponding to position 2), relative height 3 of 0.1 um (corresponding to position 3), . . . ; it can be understood that, for the isolation column corresponding to the position 1, the deformation requirement is to reduce the height by 0.1 um, for the isolation column corresponding to the position 2, the deformation requirement is to keep the height unchanged, and for the isolation column corresponding to the position 3, the deformation requirement is to increase the height by 0.1 um. After obtaining the above relative height set, the processing module can learn the deformation requirements of the isolation column in each position or the deformation requirements of each of the isolation columns according to the relative height set, then the voltage signal(s) with the corresponding magnitude(s) can be applied to the isolation column(s).

In practical applications, the position information of the height set of the encapsulation sidewall or the position information of each element in the relative height set is, for example, coordinates, and specifically the coordinates of the positions to which the height information in in this element corresponding. When the isolation columns are a plurality of isolation columns arranged at intervals, we can refer to the positions of these isolation columns when obtaining the height set of the encapsulation sidewall, to obtain the height information of the encapsulation sidewall in a position adjacent to each isolation column, and when the processing module applies the voltage signal(s) to the isolation column(s), the position information of the elements in the relative height set is corresponding, at a one-to-one basis, to the isolation column(s).

Figure 7:
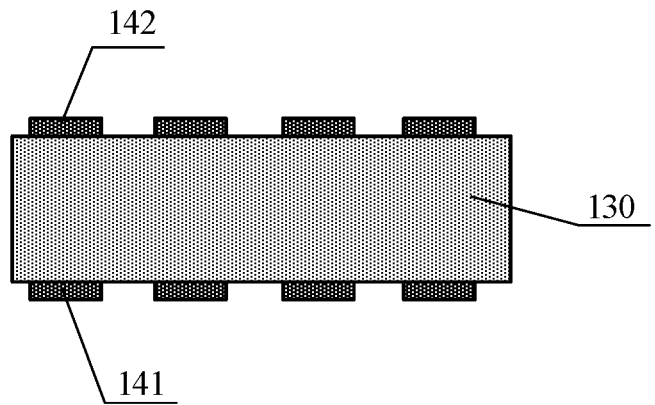
FIG. 7 is a schematic diagram showing a structure of an isolation column and a metal layer in the display provided according to some embodiments of this disclosure.

FIG. 7 is a schematic diagram showing a structure of an isolation column and a metal layer in a display provided according to some embodiments of this disclosure. When the isolation column is a circle of continuously arranged isolation column, the metal layers on the bottom and at top of the isolation column are a plurality of groups of metal layers arranged at intervals, each comprising the first metal layer 141 on the bottom and the second metal layer 142 at the top in one position of the isolation column. In this application scenario, we can refer to the positions of the metal layers in the isolation column when obtaining a height set of the encapsulation sidewall, to obtain the height information of the encapsulation sidewall in an adjacent position to each group of metal layers, and the processing module applies the voltage signal in the same way as in the embodiments above.

In view of the problem that the height of the encapsulation sidewall and the height of the isolation column are difficult to match in the related display, some embodiments of this disclosure apply the corresponding voltage signal(s) to the isolation column(s) in the corresponding position(s) by obtaining the height set of the encapsulation sidewall, or the relative height set as compared with the height of the adjacent isolation columns, to reduce or eliminate the height difference between the encapsulation sidewall and the isolation column(s).

In view of the problem that the height of the encapsulation sidewall and the height of the isolation column are difficult to match in the related display, the display provided according to some embodiments of this disclosure, normalizes the obtained height set by obtaining a height set of a plurality of positions of the encapsulation sidewall on a periphery of the non-display area of the display, to obtain an amount of deformation data (i.e., the relative height set) of the isolation column in the position corresponding to each element in the set, and then applies the voltage signal with the corresponding magnitude to the isolation column according to the relative height set, so as to reach the effect of eliminating the height difference between the isolation column and the encapsulation sidewall, thus eliminating the Newton ring phenomenon.

According to some embodiments of this disclosure, a method of fabricating a display is also provided, for fabricating the display provided according to any of the above embodiments in this disclosure.

Figure 8:
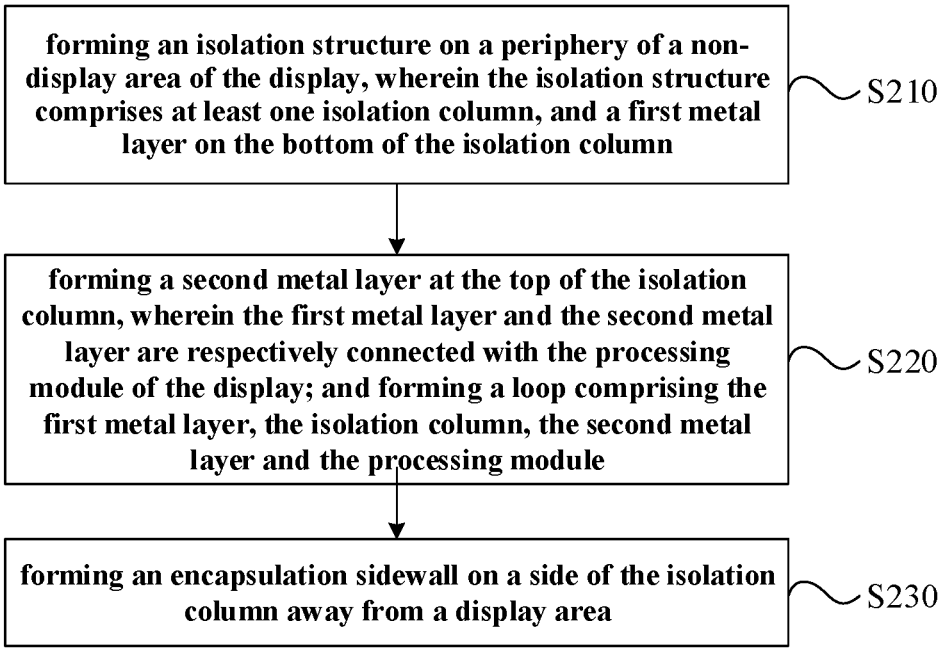
FIG. 8 is a flowchart showing a method of fabricating a display provided according to some embodiments of this disclosure.

FIG. 8 is a flowchart showing the method of fabricating a display provided according to some embodiments of this disclosure. Based on the method provided according to some embodiments of this disclosure, it may comprise the following steps:

S210: forming an isolation structure on a periphery of a non-display area of the display, wherein the isolation structure comprises at least one isolation column, and a first metal layer on the bottom of the isolation column;

S220: forming a second metal layer at the top of the isolation column, wherein the first metal layer and the second metal layer are respectively connected with the processing module of the display; and forming a loop comprising the first metal layer, the isolation column, the second metal layer and the processing module; and S230: forming an encapsulation sidewall on a side of the isolation column away from a display area.

The isolation structure and the subsequently formed package structure formed in some embodiments of this disclosure are basic structures of the package display. Referring to FIG. 1 and FIG. 2 above, the isolation column in some embodiments of this disclosure is located in a border region (specifically in the non-display area 100) between the display area and non-display area and on a side of the encapsulation sidewall close to the display area, that is, the encapsulation sidewall and the isolation column are in an adjacent position relationship, and the encapsulation cover plate is stuck to a light exit side of the encapsulation sidewall and the isolation column. In the encapsulation process of the current display, the production line usually adopts the screen printing technology for fabricating the encapsulation sidewall, but the process has the following technical defect: the encapsulation sidewall has a level difference along the horizontal and vertical directions of the scrapper, that is, as shown in FIG. 2, the encapsulation sidewall (including 120a and 120b) has an uneven height, and it is unlikely for the current encapsulating technologies to improve the phenomenon of inconsistent height of the encapsulation sidewall, therefore, the problem that the height of the encapsulation sidewall and the height of the isolation column do not match easily occurs, so that the phenomenon of Newton rings occurs on the display screen.

It should be noted that the reason and principle of forming Newton rings in the related display have been described in detail in FIG. 3 and FIG. 4 above, so they are omitted here. Some embodiments of this disclosure are described by using the isolation column located in the non-display area and adjacent to the encapsulation sidewall as an example, but for the isolation column located in the display area and adjacent to the encapsulation sidewall, similarly, the height difference between the encapsulation sidewall and its adjacent isolation column can be also eliminated, thereby eliminating the Newton ring phenomenon.

In some embodiments of this disclosure, forming the above isolation structure includes: first using a patterning process to form the first metal layer on the bottom of the isolation column, and then forming the isolation column above the first metal layer through the patterning process, wherein the fabrication of the isolation column can select a piezoelectric material, and then forming the second metal layer at the top of the isolation column through the patterning process, wherein the first metal layer and the second metal layer serve as electrodes of the processing module for controlling the height of the isolation column, and forming a loop comprising the first metal layer, the isolation column, the second metal layer and the processing module. The method of forming the encapsulation sidewall can be the related screen printing process, and the relative position relation between the encapsulation sidewall and the isolation column can refer to the display shown in FIG. 2. The processing module in the loop can apply the voltage signal to the isolation column in the loop through the first metal layer and the second metal layer, and the magnitude of the voltage signal is related to the height of the encapsulation sidewall, and the voltage signal can make the isolation column deform to eliminate the height difference with the encapsulation sidewall, thereby realizing the goal of eliminating the Newton rings.

It should be noted that, the encapsulation sidewall in some embodiments of this disclosure can also use a glass encapsulation glue, and the setting positions of the encapsulation sidewall and the isolation column, as well as the form of the isolation column can be the alternative implementations described in the above embodiments.

According to the method of fabricating a display provided by this disclosure, the main structures involved in the fabrication process is the isolation structure comprising the isolation column and the bottom metal layer (i.e., the first metal layer), and a top metal layer (the second metal layer) for applying a voltage signal can be also fabricated at the top of the isolation column, and these two metal layers form a loop together with the processing module connected therewith and the isolation column. After fabricating the internal structure of the display, the encapsulation sidewall is formed on a side of the isolation column away from the display area, i.e., the encapsulation sidewall is arranged adjacent to the isolation column; the display fabricated by the fabricating method provided by some embodiments of this disclosure can change the height of the isolation column by means of the voltage applied by the processing module, thereby eliminating the Newton rings by cancelling out the height difference between the isolation column and the encapsulation sidewall, and thus has the same technical effect as the above display.

Further, in the method of fabricating the display provided according to some embodiments of this disclosure, the display has a simple structure, which is easy to implement in the fabrication process, easy to apply to the actual production, can improve the influence on yield of the display due to an instable process of the encapsulation sidewall, improves the production efficiency, and reduces production costs.

Figure 9:
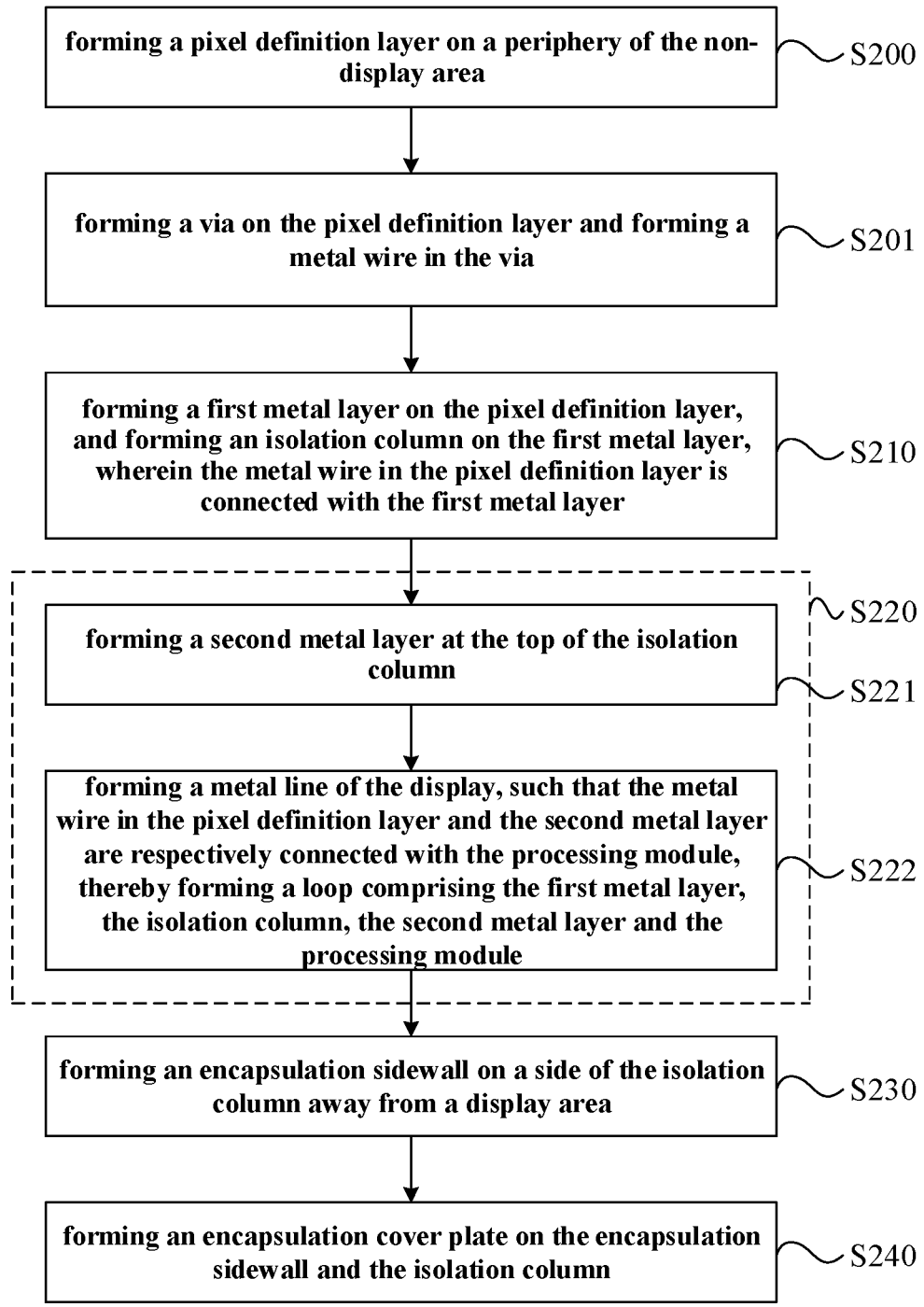
FIG. 9 is a flowchart showing a method of fabricating another display provided according to some embodiments of this disclosure.

Alternatively, FIG. 9 is a flowchart showing a method of fabricating another display provided according to some embodiments of this disclosure, and on the basis of the embodiment shown in FIG. 8, the method provided in this embodiment, before S210, can further comprise:

S200: forming a pixel definition layer on a periphery of the non-display area;

S201: forming a via on the pixel definition layer; and forming a metal wire in the via.

In some embodiments of this disclosure, the pixel definition layer is formed through a patterning process at a predetermined position (i.e., the position where the first metal layer is formed) before forming the first metal layer of the isolation structure, and the pixel definition layer has the same projection position with the isolation column, and a via for filling with metal is fabricated on the pixel definition layer by an etching process, and then filling the via with the metal to form a metal wire for connecting the first metal layer and the processing module.

Correspondingly, the implementation of S210 in some embodiments of this disclosure may comprise:

forming the first metal layer on the pixel definition layer, and forming the isolation column on the first metal layer, wherein the metal wire in the pixel definition layer is connected with the first metal layer.

Alternatively, the method provided according to some embodiments of this disclosure may comprise in S220:

S221 of forming a second metal layer at the top of the isolation column; and S222 of forming a metal line of the display, such that the metal wire in the pixel definition layer and the second metal layer are respectively connected with the processing module, thereby forming a loop comprising the first metal layer, the isolation column, the second metal layer and the processing module.

In some embodiments of this disclosure, the process of forming the second metal layer and the metal line is the same as the process of forming the first metal layer mentioned above, and when the display is an OLED, the second metal layer can be a cathode layer of the light-emitting unit in the display, that is, the second metal layer shares one metal layer with the cathode layer, which can reduce steps in the fabrication process.

Further, the method according to some embodiments of this disclosure, further comprises after S230:

forming an encapsulation cover plate on the encapsulation sidewall and the isolation column.

After forming the encapsulation cover plate, because of reasonable design and planning of the internal structure of the display in some embodiments of this disclosure, a voltage signal can be applied to the isolation column through the processing module after the display is turned on, to eliminate the height difference between the isolation column and the encapsulation sidewall according to the height of the cover plate isolation column, thereby eliminating the Newton ring phenomenon in the related display.

Based on the display and the method of fabricating the display provided according to the above embodiments of this disclosure, some embodiments of this disclosure further provide a method for the display provided according to any of the above embodiments of this disclosure.

Figure 10:
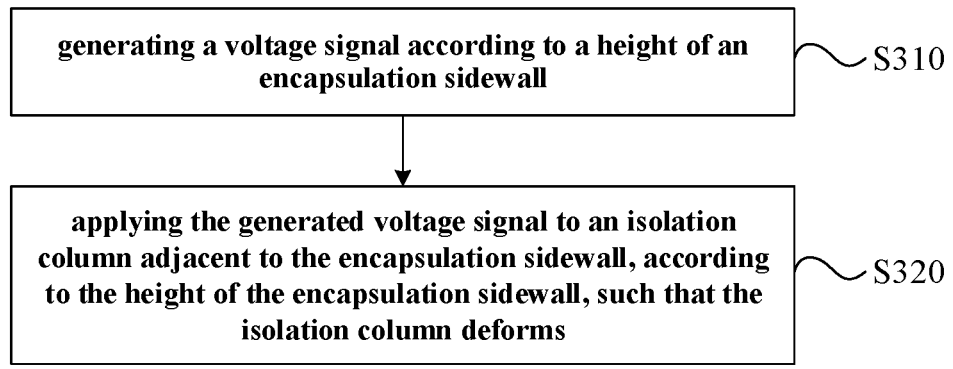
FIG. 10 is a flowchart showing a method for a display provided according to some embodiments of this disclosure.

FIG. 10 shows a flowchart of a method for a display provided according to some embodiments of this disclosure, comprising the following steps:

S310 of generating a voltage signal according to a height of an encapsulation sidewall of a display; and S320 of applying the generated voltage signal to an isolation column adjacent to the encapsulation sidewall, according to the height of the encapsulation sidewall, such that the isolation column deforms.

In some embodiments, the encapsulation sidewall is arranged on a periphery of the non-display area, and at least one isolation column is arranged on a side of the encapsulation sidewall close to the display area, and the method comprises: applying a voltage signal to the at least one isolation column in the corresponding position according to the height of the encapsulation sidewall, such that the at least one isolation column deforms. When the method for the display provided according to some embodiments of this disclosure is applied, the internal structures of the display, structural properties and alternative implementations of each structure all can refer to the display provided according to the above embodiments. Based on the feature that the display has a loop comprising the first metal layer, the isolation column, the second metal layer and the processing module, the processing module can apply a voltage signal to the isolation column in the loop through the first metal layer and the second metal layer, the magnitude of the voltage signal is related to the height of the encapsulation sidewall, and the voltage signal can deform the isolation column to eliminate the height difference with the encapsulation sidewall, thereby achieving the goal of eliminating the Newton rings.

The method for the display provided by this disclosure is used for changing the height of the isolation column by converting the height of the encapsulation sidewall to a voltage signal and applying the voltage signal to the isolation column in the position corresponding to the height of the encapsulation sidewall, thereby eliminating the Newton rings by cancelling out the height difference between the isolation column and the encapsulation sidewall. The method for the display provided according to some embodiments of this disclosure effectively eliminates the phenomenon of Newton rings on the display screen due to inconsistent height of the encapsulation sidewall, and improves the display effect of the display. Further, the method is simple, easy to implement, can improve the influence on yield of the display due to an instable process of the encapsulation sidewall, improves the production efficiency, and reduces production costs.

Figure 11:
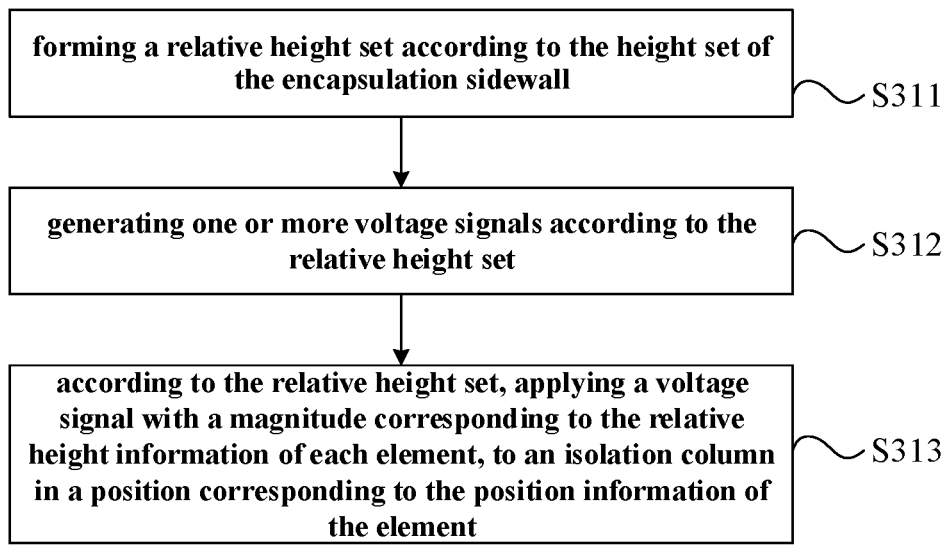
FIG. 11 is a flowchart showing a method for another display provided according to some embodiments of this disclosure.

Alternatively, FIG. 11 is a flowchart showing a method for another display provided according to some embodiments of this disclosure. As shown in FIG. 11, in the method provided according to some embodiments of this disclosure, the height of the encapsulation sidewall comprises a height set formed by a plurality of positions around the encapsulation sidewall. The method may comprise:

S311 of forming a relative height set according to the height set of the encapsulation sidewall; and S312 of generating one or more voltage signals according to the relative height set.

In some embodiments of this disclosure, each element in the relative height set of the encapsulation sidewall comprises relative height information and position information.

The method may further comprise:

S313 of according to the relative height set, applying the voltage signal with a magnitude corresponding to the relative height information of each element, to the isolation column in a position corresponding to the position information of the element.

In some embodiments of this disclosure, the height set of the encapsulation sidewall includes a plurality of elements each including height information and corresponding location information. Since the height of the isolation column 130 is relatively stable, a relative height set can be obtained based on the height set of the encapsulation sidewall 120, and the relative height set can be a set of amounts to be adjusted for the isolation columns 130. For example, the height of the isolation column is 3 um, and the elements in the height set of the encapsulation sidewall include: height 1 of 2.9 um (corresponding to position 1), height 2 of 3.0 um (corresponding to position 2), height 3 of 3.1 um (corresponding to position 3), . . . ; then the elements in the relative height set can include: relative height 1 of −0.1 um (corresponding to position 1), relative height 2 of 0 um (corresponding to position 2), relative height 3 of 0.1 um (corresponding to position 3), . . . ; it can be understood that, for the isolation column corresponding to the position 1, the deformation requirement is to reduce the height by 0.1 um, for the isolation column corresponding to the position 2, the deformation requirement is to keep the height unchanged, and for the isolation column corresponding to the position 3, the deformation requirement is to increase the height by 0.1 um. After obtaining the above relative height set, the processing module can learn the deformation requirement of the isolation column in each position or the deformation requirement of each isolation column according to the relative height set, then the voltage signal with the corresponding magnitude can be applied to the isolation column. In addition, when the isolation column is arranged in a different form, the way of obtaining the height set and the way of applying the voltage signal have already been described in detail in the above embodiments, and thus are omitted here.

Alternatively, the method provided according to some embodiments of this disclosure, before generating the voltage signal according to the height of the encapsulation sidewall, must learn the height of the encapsulation sidewall in advance, specifically by the following modes:

Mode 1: measuring the height of the encapsulation sidewall and storing the height of the encapsulation sidewall in the processor of the display; this mode uses an external device for measurement before sticking the encapsulation cover plate to the display;

Mode 2: detecting the height of the encapsulation sidewall after the display is turned on; this mode uses a measurement instrument integrated in the display for measurement.

Figure 12:
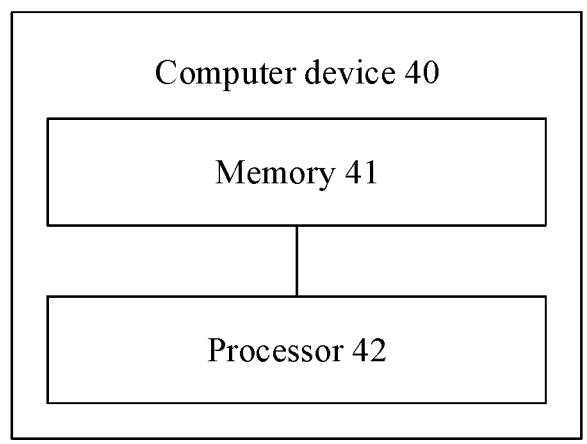
FIG. 12 is a schematic diagram showing a structure of a computer device provided according to some embodiments of this disclosure.

FIG. 12 is a schematic diagram showing a computer device provided according to some embodiments of this disclosure. The computer device 40 provided according to some embodiments of this disclosure may comprise:

a memory 41 and a processor 42, wherein the memory 41 is configured to store executable instructions; and the processor 42 is configured to implement the method for the display according to any of the above embodiments while executing the executable instructions stored in the memory 41.

The implementations of the computer device 40 provided according to some embodiments of this disclosure are substantively the same with those of the method for the display provided according to the above embodiments of this disclosure, and thus are omitted here.

According to some embodiments of this disclosure, a computer readable storage medium is further provided, wherein the computer readable storage medium stores executable instructions, which, when executed by the processor, can implement the method for the display according to any of the above embodiments of this disclosure. The implementations of the computer readable storage medium provided according to some embodiments of this disclosure are substantively the same with those of the display processing method of the display provided according to the above embodiments of this disclosure, and thus are omitted here.

Although some specific embodiments of this disclosure have been described in detail above, they are merely embodiments adopted for facilitating the understanding of this disclosure but not limiting the scope of this disclosure. A person skilled in the art could make any modification or variation on the forms and details of the embodiments, without departing from the scope and spirit of this disclosure, but the scope of patent protection of this disclosure is still determined by the scope as defined by the attached claims.

What is claimed is:

1. A display comprising:
   an encapsulation sidewall;
   at least one isolation column adjacent to the encapsulation sidewall; and
   a processing module coupled with the at least one isolation column, configured to apply a voltage signal to the at least one isolation column according to a height of the encapsulation sidewall, such that the at least one isolation column deforms, wherein:
   a first metal layer is arranged on a bottom of the at least one isolation column, a second metal layer is arranged at a top thereof, and the first metal layer and the second metal layer are respectively connected with the processing module, so as to form a loop comprising the first metal layer, the at least one isolation column, the second metal layer and the processing module; and
   a pixel definition layer is arranged below the first metal layer, a metal wire is arranged in a via of the pixel definition layer, and the metal wire is used for connecting the first metal layer and the processing module.

2. The display according to claim 1, wherein the display is an organic electroluminescent display (OLED), and the second metal layer is a cathode layer of a light-emitting element in the OLED.

3. The display according to claim 1, wherein
   the encapsulation sidewall is arranged on a periphery of a non-display area;
   the at least one isolation column is arranged on a side of the encapsulation sidewall close to a display area; and
   the processing module is configured to apply the voltage signal to the at least one isolation column in a corresponding position according to the height of the encapsulation sidewall, such that the at least one isolation column deforms.

4. The display according to claim 3, wherein the at least one isolation column is made of a piezoelectric material.

5. The display according to claim 3, wherein
   the at least one isolation column is configured to deform to have a higher height when a forward voltage signal is received, and to deform to have a lower height when a reverse voltage signal is received; or the at least one isolation column is configured to deform to have a lower height when a forward voltage signal is received, and to have a higher height when a reverse voltage signal is received.

6. The display according to claim 3, wherein the encapsulation sidewall is made of a material that is a glass encapsulation glue, wherein the encapsulation sidewall comprises one or more of the following:
- a circle of the encapsulation sidewall arranged outside the display area and in a border region with the non-display area, or
- a circle of the encapsulation sidewall arranged inside the display area and in a border region with the non-display area.

7. The display according to claim 3, wherein the at least one isolation column is a circle of a continuous isolation column located on a side of the encapsulation sidewall close to the display area; or
- the at least one isolation column is a plurality of isolation columns in a circle located on a side of the encapsulation sidewall close to the display area.

8. The display according to claim 3, wherein the processing module stores the height of the encapsulation sidewall, and the height of the encapsulation sidewall is obtained through measurement by an external device before the encapsulation cover plate is stuck to the display; or
- the display further comprises a detection module arranged inside the encapsulation cover plate of the display, wherein the detection module is configured to detect the height of the encapsulation sidewall after turning on the display.

9. The display according to claim 3, wherein the height of the encapsulation sidewall comprises a height set formed by a plurality of positions around the encapsulation sidewall, wherein that the processing module is configured to apply a voltage signal to the at least one isolation column in a corresponding position according to the height of the encapsulation sidewall comprises:
- forming a relative height set according to the height set of the encapsulation sidewall, and applying the voltage signal to the at least one isolation column in the corresponding position according to the relative height set.

10. The display according to claim 9, wherein each element in the relative height set of the encapsulation sidewall includes relative height information and position information, wherein that the processing module applies the voltage signal to the at least one isolation column in the corresponding position according to the relative height set comprises:
- according to the relative height set, applying a voltage signal with a magnitude corresponding to the relative height information of the each element, to an isolation column in a position corresponding to the position information of the each element.

* * * * *